(12) United States Patent
Guerrieri et al.

(10) Patent No.: US 6,233,012 B1
(45) Date of Patent: May 15, 2001

(54) PARASITIC CAPACITANCE REDUCTION FOR PASSIVE CHARGE READ-OUT

(75) Inventors: Roberto Guerrieri, Bologna; Marco Bisio, Modena; Marco Tartagni, Meldola, all of (IT)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/964,570

(22) Filed: Nov. 5, 1997

(51) Int. Cl.[7] ................ H04N 3/14; H04N 9/64
(52) U.S. Cl. .......... 348/300; 348/250; 348/310; 250/214 A; 330/267; 377/60
(58) Field of Search ............ 250/208.1, 214 A, 250/214 LA; 257/432, 664; 330/250, 252, 254, 255, 262, 263, 264, 267; 377/60, 57, 62, 63; 348/207, 241, 250, 294, 300, 301, 302, 308, 309, 310, 311, 315; H04N 9/64, 3/14

(56) References Cited

U.S. PATENT DOCUMENTS

| | | | |
|---|---|---|---|
| 4,454,481 | * | 6/1984 | Lewis .................... 330/307 |
| 4,902,886 | * | 2/1990 | Smisko .................. 348/241 |
| 5,019,702 | | 5/1991 | Ohzu et al. ............. 250/208.1 |
| 5,101,174 | * | 3/1992 | Hynecek ................ 330/264 |
| 5,652,150 | * | 7/1997 | Wadsworth ............ 438/60 |
| 5,652,622 | * | 7/1997 | Hycenek ................ 348/316 |
| 5,831,258 | * | 11/1998 | Street .................... 348/301 |
| 5,880,993 | * | 3/1999 | Kramer .................. 365/185.22 |
| 6,111,606 | * | 8/2000 | Ikeda .................... 348/241 |

* cited by examiner

Primary Examiner—Wendy R. Garber
Assistant Examiner—Ngoc-Yen Vu
(74) Attorney, Agent, or Firm—Theodore E. Galanthay; Lisa K. Jorgensen; Jeffrey K. Weaver

(57) ABSTRACT

A circuit technique to reduce the input capacitance line of a charge integrator is described. This approach is particularly tailored for embedded read-out circuits in solid-state integrated sensors. An integrated charge amplifier described herein includes a generic amplifier element and a high speed buffer which drives a metal shield placed underneath the input line. The metal shield therefore follows the potential of the input line and thereby reduces the capacitance between the input line and ground.

22 Claims, 2 Drawing Sheets

PARASITIC CAPACITANCE REDUCTION FOR PASSIVE CHARGE READ-OUT

BACKGROUND OF THE INVENTION

The present invention pertains to integrated circuit designs providing features which reduce the capacitance on input lines to certain circuit elements such as charge amplifiers.

Parasitic input capacitance is of great importance in charge readout performance. In many integrated circuits containing arrays of data elements (e.g., memory devices having arrays of memory cells and imagers having arrays of pixels), amplifiers read out charge stored on the individual elements of the array. Ideally, the readout should be performed rapidly and accurately. Unfortunately, a large input line capacitance requires that some of the charge initially injected to the amplifier be used to charge the "input line capacitor." This of course slows the readout time and reduces or increases that amount of charge provided to the amplifier.

From the perspective of a charge amplifier, the main effects of input capacitance are (1) time response, (2) gain, and (3) output linearity. If $C_L$, $C_R$ A, and $\delta Q$ are the input capacitance, the feedback capacitance, the voltage gain, and the injected charge respectively, the output of the charge amplifier is inversely proportional to $C_R$ according to the relation $\Delta V_o = \delta Q/(C_L/A)+(1+(1/A))C_R)$ and the time response is proportional to the loop gain, $C_R/(C_R+C_L)$. From the previous analysis, two observations can be drawn: (i) the output linearity is seriously affected by the input capacitance for low amplifier gain, and (ii) gain and speed of the amplifier are traded off as in a generic negative feedback system. Thus, the speed of the system benefits greatly from a reduction on the input line capacitance.

For applications as in the field of CMOS optical sensors, the input line capacitance, Cr, is composed of the diffusion and metal capacitances of the line as shown in FIG. 1. There, a photodiode 8 is connected to a charge amplifier input line 10 via a switch 12. Photodiode 8 may be provided in a single pixel of a photodiode array of a CMOS imager, for example. When switch 12 is closed, charge stored on photodiode 8 is provided over input line 10 to a capacitor 16. Charge accumulated on capacitor 16 provides a voltage across the plates of the capacitor, which voltage may be read by an amplifier 14. The detected voltage should represent the charge stored on photodiode 8. A switch 18 is provided to allow reset of photodiode 8. During reset (after readout), switch 18 is closed so that the output of charge integrate toward it is provided to line 10, thereby resetting photodiode 8 while switch 12 is closed. This procedure resets photodiode 8 to reference voltage, $V_R$.

Input line 10 includes two sources of parasitic capacitance: a metal capacitance illustrated as an idealized capacitor 20 and a diffusion capacitance illustrated as an idealized capacitor 22. The metal capacitance is created by the dielectric between the metal input line and the grounded substrate or other conductive features insulated from but proximate to line 10. Its effect is manifested when a potential change is applied to line 10, thereby changing the charge stored on the capacitor electrodes (i.e., the metal line and the substrate). The diffusion capacitance is created by a p-n junction at the interface of a diffusion (e.g., a photodiode diffusion) and a surrounding well or bulk region. When the diffusion is charged or discharged (as by injecting charge onto line 10), the capacitor defined by a p-n junction depletion region is charged or discharged. For most of integrated circuit designs in production today, about one half of the input line capacitance is due to the metal line (with the other half provided by the diffusion(s)).

In view of the above, it is clear that device performance could be significantly improved by designs that reduce input line capacitance from the diffusion and/or metal line components.

SUMMARY OF THE INVENTION

To reduce the input line capacitance with respect to the ground, the present invention provides circuitry which drives a metal shield provided underneath, and in relatively close proximity to, a metal input line. Preferably, the shield is driven by a buffer directly connected to the input line. Thus, the potential of the metal shield follows that of the input line thereby reducing the capacitive charge stored on the metal line. Of course, an amplifier is also coupled to the input line. If the speed of the buffer is greater than that of the amplifier, the input metal capacitance may be largely neglected. To further improve the system performance, diffusions of the input line may be placed in wells whose potential is driven by the buffer.

In one aspect, the invention may be characterized as an integrated circuit including the following features: (a) an amplifier for reading the output of individual cells in the integrated circuit; (b) an input line connecting the amplifier to at least one of the individual cells; (c) a shield line provided underneath and capacitively coupled to the input line; and (d) a circuit element conductively connecting the shield line to the input line, such that the circuit element provides a potential to the shield line which follows an input potential on the input line. This reduces the capacitive load on the input line. In one embodiment, the circuit element is a unity gain buffer such as a pull-up amplifier.

If the integrated circuit is a CMOS imager, the individual cells are pixels, for example. If the integrated circuit is a memory array, the individual cells are storage elements.

In one preferred embodiment, the shield line is a metal line. Depending upon where the input line resides in the integrated circuit, the metal line may be provided between two metallization layers, beneath a first metallization layer, etc. If the individual cells contain diffusions in wells, the shield line may be conductively coupled to the wells. This can reduce the diffusion capacitance associated with the individual cells of the array.

In another aspect, the invention may be characterized as a method of reducing a capacitive load on an input line to an amplifier on an integrated circuit. This method may be characterized as including the following events: (a) operating the integrated circuit such that the signal on a cell of the integrated circuit is provided on the input line to the amplifier; and (b) providing the signal to a shield line provided beneath the input line and capacitively coupled thereto, such that the signal on the shield line follows the signal on the input line to reduce the capacitive load on the input line.

Yet another aspect of the invention provides a system for producing an image of an object. This system includes an imager including a low capacitance input line of the type described above and one or more components for outputting an image resulting from the outputs of one or more pixels. The image may be a photograph in the case of a digital camera for example.

These and other features and advantages of the invention will be described below in the Detailed Description section with reference to the appended drawings.

DETAILED DESCRIPTION OF THE PREFERRED EMBODIMENTS

The invention will be described with reference to certain preferred embodiments set forth below. Specifically, the invention will be described with reference to a particular MOS imager sensor design and a few variants. It should be understood that the invention is in no way specifically limited to these embodiments. For example, the invention may be applied to reduce the input line capacitance of charge integrators employed with various memory devices.

Figure 1:
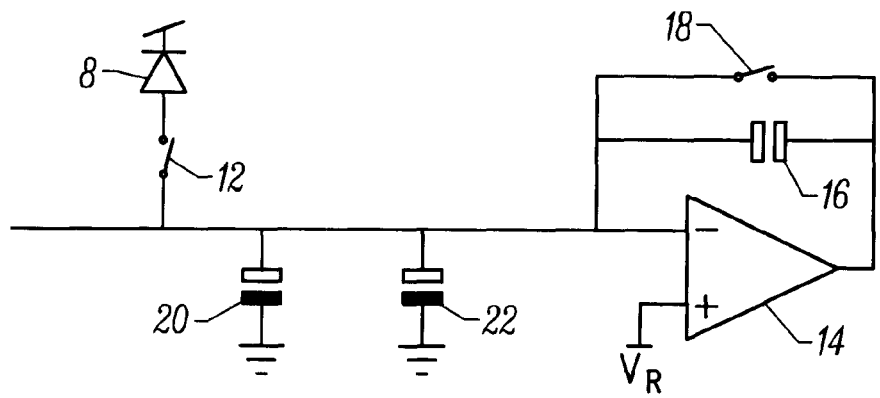
FIG. 1 is a schematic diagram illustrating the sources of input line capacitance to a generic amplifier element.
Figure 2A:
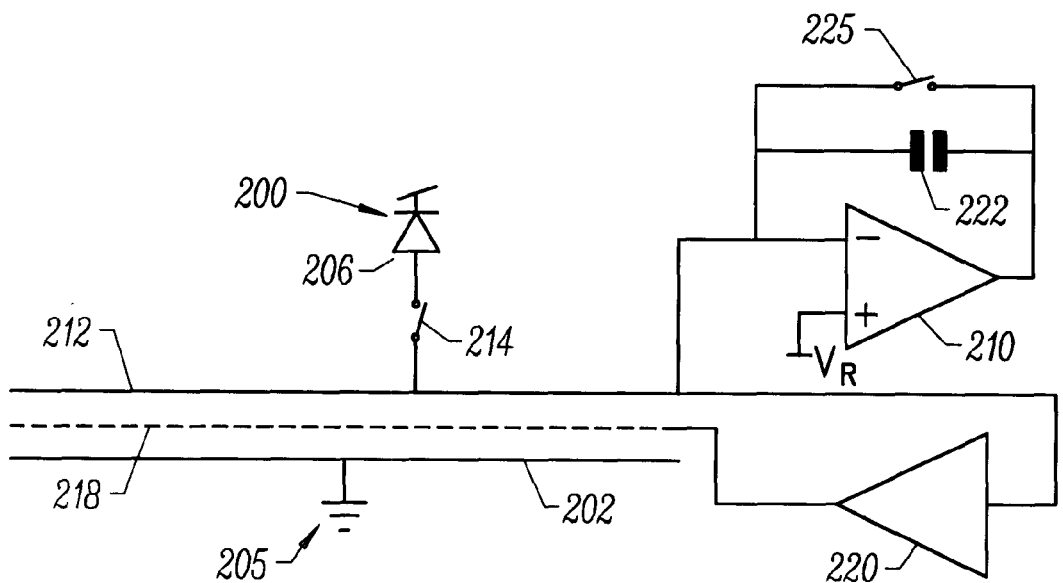
FIG. 2A is a schematic diagram of a circuit employing a buffer and a metal shield placed underneath the input line of a charge amplifier in accordance with this invention
Figure 2B:
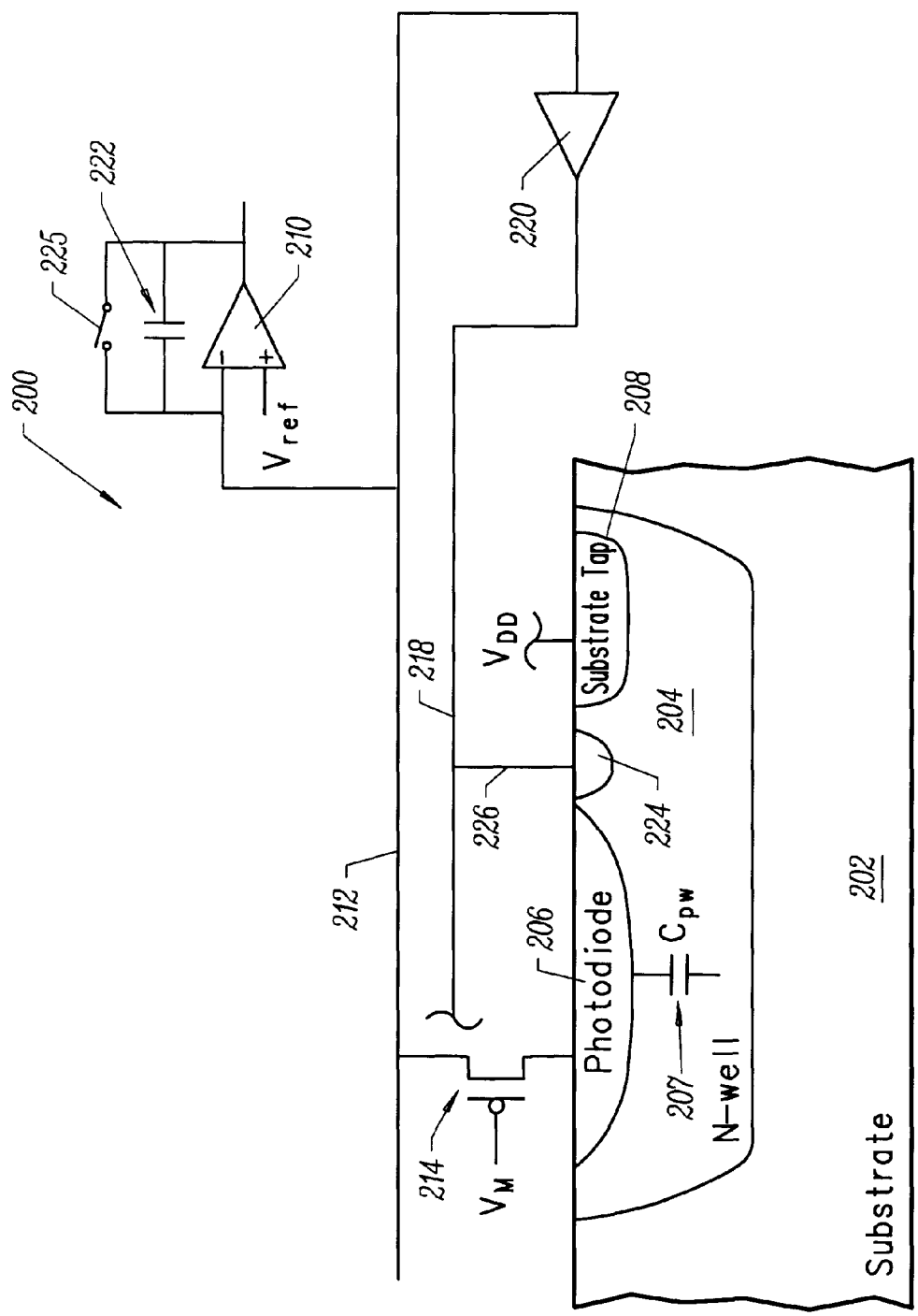
FIG. 2B is a cross-sectional diagram of the circuit of FIG. 2A as applied to a passive photodiode pixel, of a type suitable for use with an MOS imager.

The invention will now be described by example in the context of an MOS imager having a photodiode array. A pixel of the imager as connected to a charge amplifier is illustrated in FIGS. 2A and 2B. To reduce the complexity of the diagrams, only a single pixel is shown. It should be understood that a plurality of pixels typically will be provided on a single input line.

As depicted schematically in FIG. 2A, a pixel 200 includes a photodiode 206 coupled to an input line 212 by a switch 214. Input line 212 is shown extending beyond pixel 200 to the left to illustrate that other pixels may be connected to the same line. As in conventional systems, input line 212 is coupled to an amplifier 210. In this instance, amplifier 210 is an operational charge amplifier connected in parallel to a capacitor 222 which receives charge from pixel 200 and thereby establishes a voltage difference between its plates. Amplifier 210 can then detect the voltage difference across the electrodes of capacitor 222 and thereby gauge the charge that has been injected onto line 212. During this readout procedure, a switch 225 (connected in parallel to capacitor 222) remains open so that capacitor 222 can maintain a potential difference across its plates. After readout, switch 225 closes so that a reference voltage, $V_R$, is provided to photodiode 206 via line 212. This resets photodiode 206 to $V_R$.

In a conventional system, when a photodiode or other array element injects charge onto an input line, that line must first pull up the potential of other conductive structures to which it is capacitively coupled. For example, it must pull up the local potential of a substrate 202 on which the array is fabricated. Typically, substrate 202 will be coupled to ground 205 and therefore held at a relatively fixed potential. Thus, upon charge injection, the change in potential necessary for current flow on line 212 is resisted by capacitive coupling to substrate 202 or other local conductive structures.

Similarly, a p-n junction capacitor formed between a diffusion of photodiode 206 and the surrounding well or bulk resists charge injection from the photodiode diffusion to input line 212. This capacitor and a mechanism to counter it are illustrated in more detail in FIG. 2B.

To counter the metal line capacitance described above, the present invention provides a conductive shield line 218 formed beneath input line 212. Shield line 218 effectively shields input line 212 from substrate 202 and/or other conductive structures to which it is capacitively coupled. Essentially, shield line 218 converts what had been a single capacitor (metal line-dielectric-substrate) into two capacitors connected in series. The overall capacitance of the system remains about the same, but input line 212 is most directly affected by shield line 218.

To reduce the capacitive loading on line 212, the potential difference between it and shield line 218 should be minimized. This is accomplished by forcing the two lines to track one another. Preferably, this conductive connection is provided by a circuit element such as a unity-gain buffer 220 illustrated in FIG. 2A.

Unity-gain buffer 220 drives metal shield 218 so that its potential follows that of input line 212. If the speed of buffer 220 is greater than that of amplifier 210, the input metal capacitance can be substantially neglected. To further improve the system performance, as described below, diffusions on input line 212 (e.g., the diffusion of photodiode 206) can be placed in wells whose potential is also driven by unity-gain buffer 220.

As depicted structurally in FIG. 2B, pixel 200 is formed on semiconductor substrate 202. An n-well 204 is formed on the upper part of substrate 202, which may be an epitaxial layer for example. In a preferred embodiment, well 204 is limited to a single pixel as shown. However, it is within the scope of this invention to employ a well that spans multiple pixels in a two-dimensional array. Within each pixel, p-type photodiode diffusion 206 is provided to store charge upon exposure to radiation. In addition, each pixel 200 includes a substrate tap 208 for holding the well 204 at a fixed voltage such as $V_{dd}$. Substrate tap 208 may be a highly doped n-type region for providing a low resistance ohmic contact to well 204. Substrate tap 208 connects to an appropriate power source via an appropriate contact or interconnect.

Various optical layers/elements may be provided on pixel 200—at least on diffusion 206. To simplify the diagrams these additional elements are not shown in FIGS. 2A and 2B. Exemplary optical elements may include a lens for optical collection of photons and filters for wavelength discrimination of photons (as used in color pixels).

It should be understood that while pixel 200 is depicted as having an n-type well and a p-type photodiode diffusion, the invention is not limited to this arrangement. Thus, well 204 could be a p-type region and diffusion 206 could be an n-type region. In either case, the concentration of dopant atoms in regions 204 and 206 should be chosen to create a depletion mode photodiode. In such photodiodes, radiation impinging on photodiode diffusion 206 causes generation of holes and electrons in the depletion region. Because the depletion region does not contain free charge carriers, these newly created holes and electrons are not immediately annihilated by combination with charge carriers of the opposite charge. Thus, they reside as free charge on a capacitor $C_{pw}$ 207 defined at the p-n junction between the photodiode diffusion 206 and the well 204. The capacitance of $C_{pw}$ is sometimes referred to as the photodiode's "intrinsic capacitance."

During normal operation, pixel 200 is exposed to a source of radiation for a defined period of time. The flux of radiation (intensity) integrated over the length of the exposure time defines an "integrated illumination" which is related to the amount of charge that builds up on the capacitor defined by the p-n junction of diffusion 206 and well 204. To "read" pixel 200, photodiode 206 is discharged so that the amount of stored charge can be determined. This charge specifies the integrated illumination which can be converted to a radiation intensity based upon the known exposure time. The outputs of all pixels in the array are used to create a radiation intensity distribution or image.

As noted, the pixel output is coupled to amplifier 210 by an input line 212 and a switch 214 (depicted here as a transistor). While photodiode 206 is exposed to radiation, transistor 214 is switched off so that the charge accumulates in pixel 200. When pixel 200 is to be read, transistor 214 switches on so that the charge accumulated in photodiode diffusion 206 can flow over input line 212 to amplifier 210 and capacitor 222 (connected in parallel with amplifier 210). Amplifier 210 then measures the voltage across capacitor 222 and generates an output corresponding to the quantity of radiation received at photodiode 206.

Shield line 218 is coupled to input line 212 via unity-gain buffer 220 as described above. Preferably, shield line 218 is provided directly underneath input line 212, but is may be offset by a small amount if necessary for routing or other design considerations. Also, it may be provided above line 212 if there is substantial capacitive coupling to overlying conductive structures. Further, shield line 218 preferably mimics the size, shape, and location of line 212. In practice, line 218 may be provided in a metalization layer directly underneath the metalization layer on which input line 212 is formed. Alternatively, it may be formed at an intermediate position between the metalization layer of line 212 and one of the adjacent metallization lines. In such cases, the inter-metal dielectric (IMD) must be formed in two stages so that the shield line can be formed therebetween. If input line 212 is formed on a first metalization line, then it may be desirable to form shield line 218 at an intermediate position in the inter-layer dielectric (ILD). In such cases, the ILD should be formed in two stages, which is now a common fabrication technique. Shield line 218 will be formed between two ILD sublayers.

To reduce the diffusion capacitance component of the input line capacitance, well 204 is maybe coupled to shield line 218 by an ohmic contact 224 and a contact line 226. Thus, when the potential on line 212 changes, the well potential is pulled up or down with it. This reduces the p-n junction capacitance at $C_{pw}$ 207.

Many different types of amplifier may benefit from the shielded input lines of this invention, not just charge integrators as indicated in FIGS. 2A and 2B. In general, the amplifier should be slower than the buffer driving the shield line. This often means that the frequency band width of buffer 220 will be greater than that of amplifier 210. Structurally, buffer 220 may be of any design meeting the above criterion. In a simple case, it may be a two transistor follower or pull-up amplifier.

The output of amplifier 210 will be an analog signal indicating the integrated illumination of a currently analyzed pixel. In order to easily analyze this signal, the analog signal should first be converted to a digital signal. This may be accomplished with analog-to-digital converter which is preferably formed on the same chip with the pixel array.

Amplifiers with shielded input lines of this invention may be deployed in various systems for military, scientific, business, and home applications. When used with memory chips, for example, they may be employed computer systems, databases, personal digital assistants, network hardware, etc. Such systems will include associated processing logic, input/output circuitry, etc. When used with optical imagers, for example, they may be used in digital cameras, video recorders, night driving displays, etc. Such systems will generally include, in addition to the MOS imager chip, optics to capture an image and direct it onto the MOS array. This may include one or more lenses, filters, etc. of the types conventionally employed in image capture systems. The optics and MOS imager will be mounted in a casing such as a camera case. Further, the system may include a memory for temporarily storing captured images for later downloading to a display system. In some instances, the display system itself will form part of the overall imager system.

Although the foregoing invention has been described in some detail for purposes of clarity of understanding, it will be apparent that certain changes and modifications may be practiced within the scope of the appended claims. For example, while the specification has described certain input line shield designs which accomplish the objectives of the present invention, many others which will be understood by those of skill in the art from the present disclosure to be within the spirit of the present invention may equally be used. For example, while the specification has exemplified a single metallic shield line provided beneath an input line, other shield designs such as wide area plates also could be used with the invention. In addition, the shielding designs of this invention could profitably find use in protecting generic metal lines other than input lines specifically directed to amplifiers. Still further, the shielding structure need not be a unitary metallic line as exemplified herein. Rather it may be a conductive polymer or a dielectric impregnated with conductive particles, etc. Therefore, the present embodiments are to be considered as illustrative and not restrictive, and the invention is not to be limited to the details given herein, but may be modified within the scope of the appended claims.

What is claimed is:

1. An integrated circuit comprising:
    an amplifier for reading the output of individual cells in said integrated circuit;
    an input line connecting said amplifier to at least one of said individual cells;
    a shield line provided underneath and capacitively coupled to said input line; and
    a circuit element conductively connecting said shield line to said input line, such that the circuit element provides a potential to said shield line which potential follows an input potential on the input line thereby reducing the capacitive load on the input line.

2. The integrated circuit of claim 1, wherein the individual cells are pixels in a CMOS imager.

3. The integrated circuit of claim 1, wherein the individual cells are storage elements in a memory array.

4. The integrated circuit of claim 1, wherein the shield line is a metal line provided intermediate two metallization layers of the integrated circuit.

5. The integrated circuit of claim 1, wherein the shield line is a metal line provided beneath a first metallization layer of the integrated circuit.

6. The integrated circuit of claim 1, wherein the circuit element is a unity gain buffer.

7. The integrated circuit of claim 6, wherein the unity gain buffer is a pull-up amplifier.

8. The integrated circuit of claim 1, wherein the individual cells contain diffusions in wells and wherein said shield line is conductively coupled to said wells.

9. A system for producing an image of an object, the system comprising:
    (a) an MOS imager comprising,
        (i) one or more pixels capable of providing outputs indicative of a quantity or a type or both the quantity and type of radiation to which each of the one or more pixels has been exposed,
        (ii) an amplifier for reading the output of individual pixels in said MOS imager;
        (iii) an input line connecting said amplifier to at least one of said individual pixels;

(iv) a shield line provided underneath and capacitively coupled to said input line; and (v) a circuit element conductively connecting said shield line to said input line, such that the circuit element provides a potential to said shield line which potential follows an input potential on the input line thereby reducing the capacitive load on the input line; and (b) means for outputting an image resulting from the outputs of the one or more pixels.

10. The system of claim 9, wherein the MOS imager further comprises an analog-to-digital converter capable of receiving analog outputs from said one or more pixels, converting the analog outputs to digital signals, and providing the digital signals to said one or more circuit elements such that the one or more circuit elements can identify faulty pixels.

11. The system of claim 9, wherein the pixels contain diffusions in wells and wherein said shield line is conductively coupled to said wells.

12. The system of claim 9, wherein the shield line is a metal line provided intermediate two metallization layers of the MOS imager.

13. The system of claim 9, wherein the shield line is a metal line provided beneath a first metallization layer of the MOS imager.

14. The system of claim 9, wherein the circuit element is a unity gain buffer.

15. The system of claim 14, wherein the unity gain buffer is a pull-up amplifier.

16. A method of reducing a capacitive load on an input line to an amplifier on an integrated circuit, the method comprising:

(a) operating said integrated circuit such that the signal on a cell of the integrated circuit is provided on the input line to the amplifier; and (b) providing said signal to a shield line provided beneath said input line and capacitively coupled thereto, such that the signal on said shield line follows the signal on said input line to thereby reduce the capacitive load on said input line.

17. The method of claim 16, wherein the signal is provided to said shield line by a unity gain buffer conductively connecting said shield line to said input line.

18. The method of claim 17, wherein said unity gain buffer is a pull-up amplifier.

19. The method of claim 16, wherein the integrated circuit comprises a CMOS imager.

20. The method of claim 16, wherein the integrated circuit comprises a memory array.

21. The method of claim 16, wherein the shield line is a metal line provided intermediate to metallization layers of the integrated circuit.

22. The method of claim 16, wherein the shield line is a metal line provided beneath a first metallization layer of the integrated circuit.

* * * * *